United States Patent
Lin et al.

(10) Patent No.: US 7,888,695 B2
(45) Date of Patent: Feb. 15, 2011

(54) LIGHT EMITTING DEVICE AND MANUFACTURE METHOD THEREOF

(75) Inventors: Yu-Chuan Lin, Hsin-Chu (TW); Shau-Yu Tsai, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 683 days.

(21) Appl. No.: 11/892,832

(22) Filed: Aug. 28, 2007

(65) Prior Publication Data
US 2008/0316745 A1    Dec. 25, 2008

(30) Foreign Application Priority Data
Jun. 20, 2007    (TW) .............................. 96122195 A

(51) Int. Cl.
*H01L 21/44* (2006.01)
(52) U.S. Cl. ................... 257/98; 257/99; 257/E33.056; 362/249.02
(58) Field of Classification Search ................... 257/98, 257/99; 362/249.02
See application file for complete search history.

(56) References Cited

U.S. PATENT DOCUMENTS 7,808,580 B2 * 10/2010 Song et al. .................... 349/69
2004/0037080 A1 * 2/2004 Luk et al. .................... 362/252
2004/0184737 A1 * 9/2004 Oono et al. .................... 385/52
2005/0184403 A1 * 8/2005 Inagawa .................... 257/784
2007/0121326 A1 * 5/2007 Nall et al. .................... 362/294
2007/0235874 A1 * 10/2007 Inagawa .................... 257/738
2008/0259240 A1 * 10/2008 Song et al. .................... 349/62
2009/0310339 A1 * 12/2009 Jung .................... 362/97.3
2010/0149769 A1 * 6/2010 Lee et al. .................... 361/768

FOREIGN PATENT DOCUMENTS

CN    1383219 A    12/2002

* cited by examiner

*Primary Examiner*—Alexander G Ghyka
(74) *Attorney, Agent, or Firm*—Bacon & Thomas, PLLC

(57) ABSTRACT

A manufacture method of a light emitting device is provided. Firstly, at least one circuit board is provided. A plurality of light emitting packages, a first undetermined power input end and a second undetermined power input end are disposed at the circuit board. The light emitting packages are electrically connected to the first undetermined power input end and the second undetermined power input end. Each of the first undetermined power input end and the second undetermined power input end has at least two first pads. The first pads of each of the first undetermined power input end and the second undetermined power input end are electrically isolated from each other. Next, the first undetermined power input end is selected to be a power input region for inputting an external power signal. Then, the first pads of the second undetermined power input end are electrically connected to each other.

9 Claims, 5 Drawing Sheets

LIGHT EMITTING DEVICE AND MANUFACTURE METHOD THEREOF

This application claims the benefit of Taiwan application Serial No. 96122195, filed on Jun. 20, 2007, the subject matter of which is incorporated herein by reference.

BACKGROUND OF THE INVENTION

1. Field of the Invention

The invention relates in general to a light emitting device and a manufacture method thereof, and more particularly to a light emitting device with a light source disposed on a circuit board and the manufacture method thereof.

2. Description of the Related Art

If a light emitting diode (LED) element is used as a light source in a backlight module, the LED element is normally soldered on a circuit board to form a lighting bar. The lighting bar is further incorporated with other optical elements and is disposed in the backlight module. The backlight module is classified into an edge type backlight module and a direct type backlight module according to a light-emitting surface of the light source.

Let an edge type backlight module be taken for example. For the convenience of the assembly and operation of the edge type backlight module, power lines for inputting an external power are disposed at the same side of the edge type backlight module. As a result, circuit boards soldered with LED elements need to have two different forms. Although according to the design of a linked board diagram, the circuit boards of different forms can be formed on the same linked board. However, the number of the circuit boards formed on the linked board is limited to be even, hence increasing the manufacture cost.

In addition, if LED elements comprise chips of three colors, for example, red, green and blue, the arrangement of the chips in the same kind of the LED elements is the same. Referring to FIG. 1, a perspective of a direct type backlight module is shown. The direct type backlight module 100 comprises a plurality of circuit boards 110. Each of the circuit boards 110 has a plurality of LED elements 111 in the same form. The LED elements 111 are used as light sources of the direct type backlight module 100.

As the LED elements 111 herein are in the same form, the arrangement of the chips of three colors in the LED elements 111 is the same. That is, the arrangement of the chips is a red chip 112, a green chip 113 and a blue chip 114 in order. As illustrated in FIG. 1, under such arrangement, a particular color tends to be over-concentrated in a certain direction.

Thus, when the direct type backlight module 100 is in use, several color bands are formed by over-concentrated colors, hence affecting display qualities. Although the above problem can be avoided through the design of different circuit boards, the circuit boards on the same linked board are still subjected to the above limitation that the number of the circuit boards has to be even.

SUMMARY OF THE INVENTION

The invention is directed to a light emitting device and a manufacture method thereof. Two undetermined power input ends are disposed on a circuit board, so that the application of the light emitting device having such circuit board is more flexible.

According to a first aspect of the present invention, a manufacture method of a light emitting device is provided. Firstly, at least one circuit board is provided. A plurality of light emitting packages, a first undetermined power input end and a second undetermined power input end are disposed on the circuit board. The light emitting packages are electrically connected to the first undetermined power input end and the second undetermined power input end. Each of the first undetermined power input end and the second undetermined power input end has at least two first pads electrically isolated from each other. Next, the first undetermined power input end is selected to be a power input region for inputting an external power signal. Then, the first pads of the second undetermined power input end are electrically connected to each other According to a second aspect of the present invention, a light emitting device is provided. The light emitting device is disposed in a display apparatus. The light emitting device comprises a plurality of light emitting packages and at least one circuit board. The light emitting packages are disposed on the circuit board. The circuit board comprises a first undetermined power input end and a second undetermined power input end. The first undetermined power input end and the second undetermined power input end are respectively disposed at two ends of the circuit board. The first undetermined power input end and the second undetermined power input end are electrically connected to the light emitting packages. Each of the first undetermined power input end and the second undetermined power input end has at least two first pads. The first undetermined power input end is a power input region. The first pads of the second undetermined power input end are electrically connected to each other.

The invention will become apparent from the following detailed description of the preferred but non-limiting embodiments. The following description is made with reference to the accompanying drawings.

DETAILED DESCRIPTION OF THE INVENTION

First Embodiment

Figure 1:
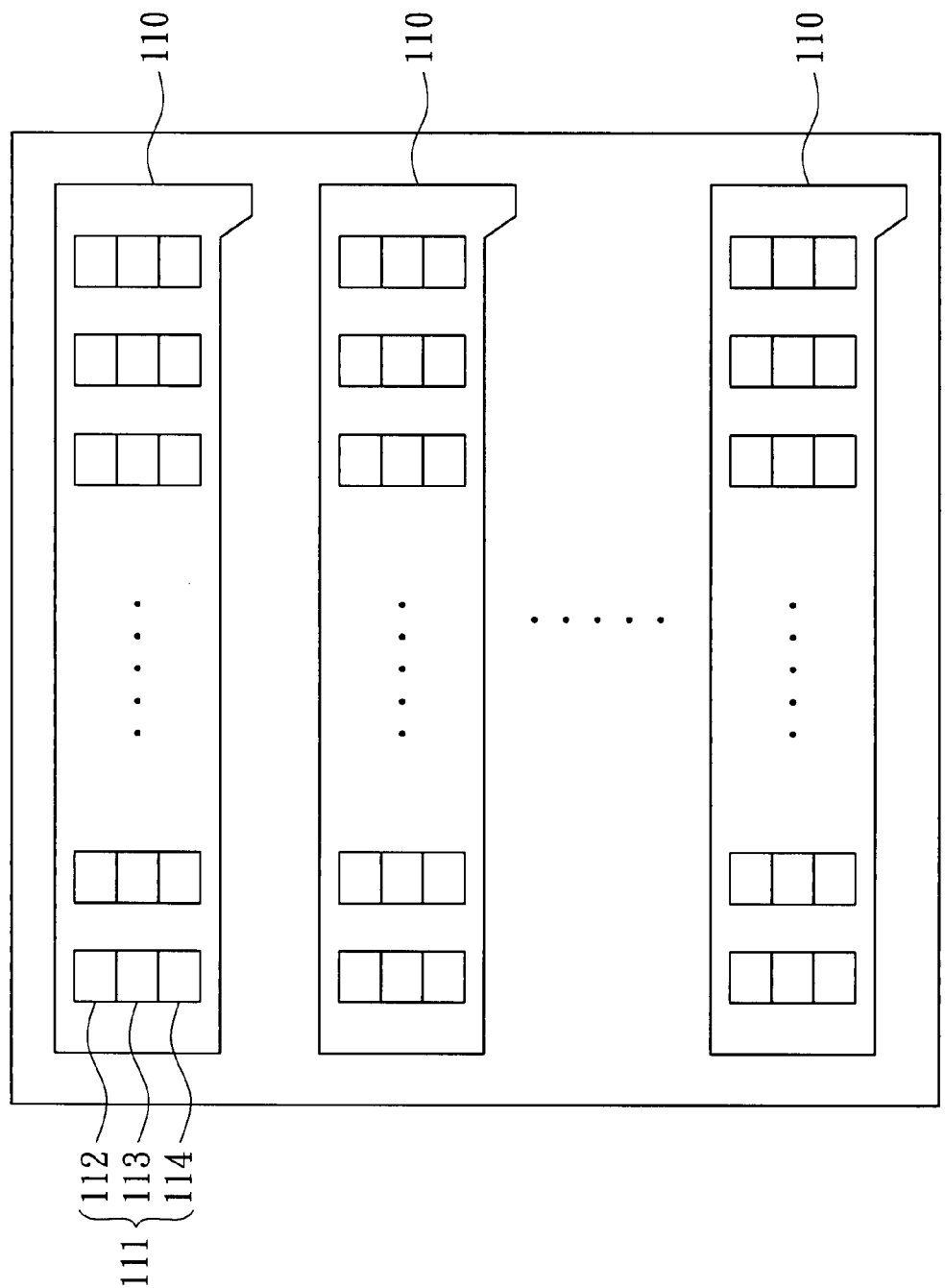
FIG. 1 (Related Art) is a perspective of a direct type backlight module.
Figure 2:
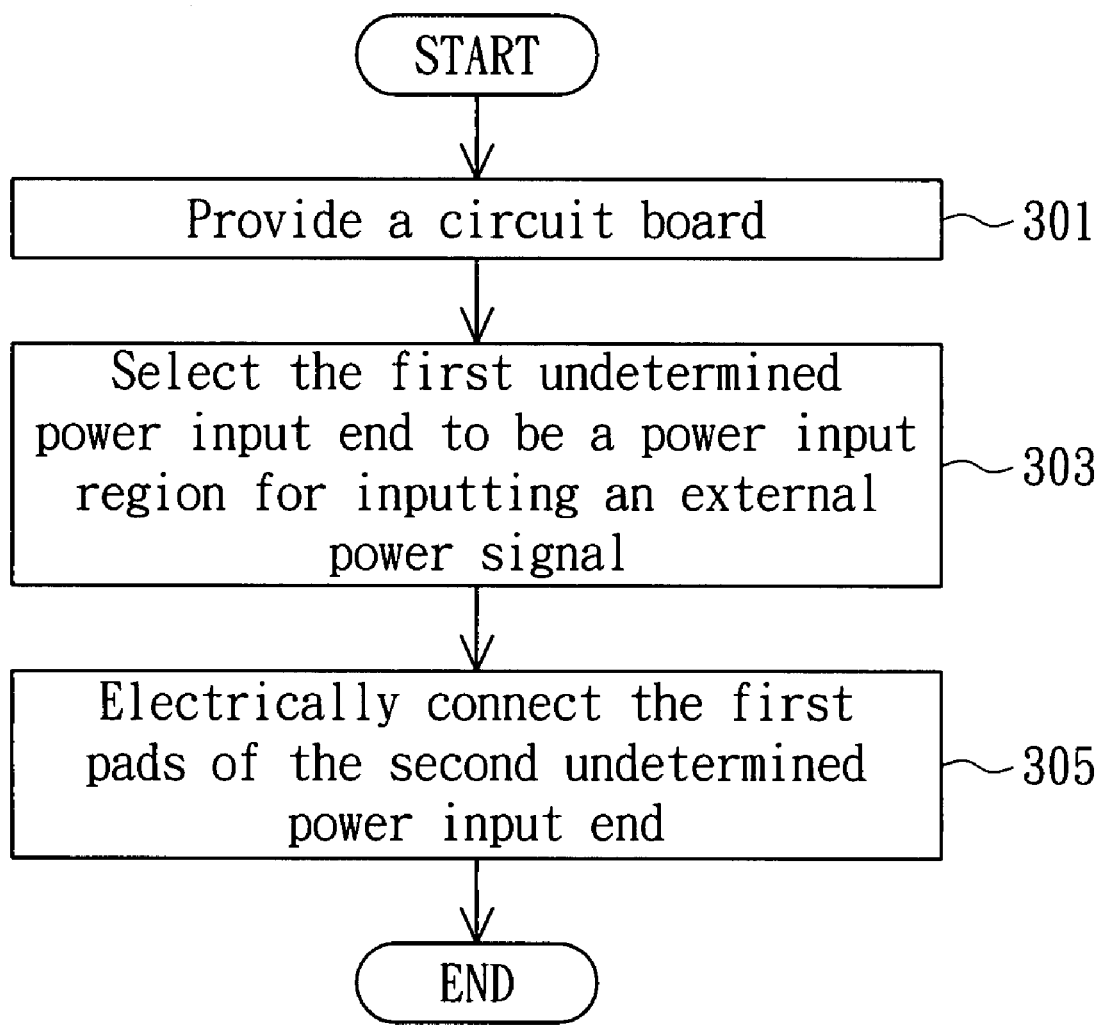
FIG. 2 is a flowchart of a manufacture method of a light emitting device according to the invention.
Figure 3A:
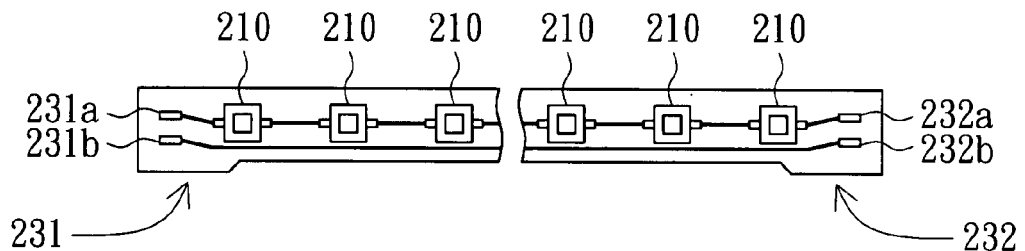
FIGS. 3A~3C illustrate processes of the manufacture method of the light emitting device of FIG. 2.
Figure 3B:
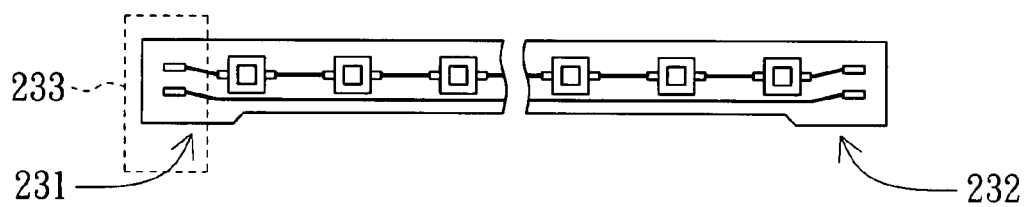
Figure 3C:
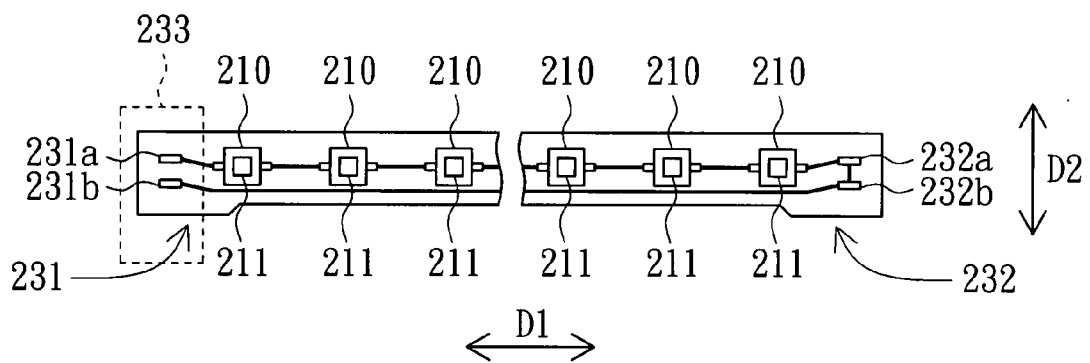

Referring to both FIG. 2 and FIGS. 3A~3C. FIG. 2 is a flowchart of a manufacture method of a light emitting device according to the invention. FIGS. 3A~3C illustrate processes of the manufacture method of the light emitting device of FIG. 2.

Firstly, as illustrated in FIG. 2 and FIG. 3A, proceeds to step 301, a circuit board 230 is provided. A plurality of light emitting packages 210, a first undetermined power input end 231 and a second undetermined power input end 232 are disposed on the circuit board 230. The first undetermined power input end 231 and the second undetermined power input end 232 are respectively disposed at two ends of the circuit board 230. The light emitting packages 210 are electrically connected to the first undetermined power input end 231 and the second undetermined power input end 232. The first undetermined power input end 231 has two first pads 231a and 231b, and the second undetermined power input end 232 has two first pads 232a and 232b. The first pads 231a and 231b are electrically isolated from each other, and the first pads 232a and 232b are electrically isolated from each other.

Next, as illustrated in FIG. 2 and FIG. 3B, proceeds to step 303, the first undetermined power input end 231 is selected to be a power input region 233 for inputting an external power signal. In the present embodiment of the invention, the first undetermined power input end 231 is selected to be the power input region 233. However, in step 303, the second undetermined power input end 232 also can be selected to be the power input region 233. The selection in step 303 is determined according to a user's requirement.

Then, as illustrated in FIG. 2 and FIG. 3C, the manufacture method proceeds to step 305, the first pads 232a and 232b of the second undetermined power input end 232 are electrically connected to each other. In the present embodiment of the invention, as the first undetermined power input end 231 is selected to be the power input region 233 in step 303, the first pads 232a and 232b of the second undetermined power input end 232 are electrically connected to each other in step 305. Thus, the light emitting device 200 of the present embodiment of the invention is formed after the above steps, and the external power signal is inputted to each of the light emitting packages 210 through the first pads 231a and 231b of the power input region 233.

According to the light emitting device and the manufacture method thereof disclosed in the present embodiment of the invention, the first undetermined power input end and the second undetermined power input end are respectively disposed on the two ends of the circuit board, so that a user, according to his (or her) requirement, can select one of the first undetermined power input end and the second undetermined power input end to be the power input region for inputting the external power signal. The first pads of the other one of the first undetermined power input end and the second undetermined power input end are then electrically connected to each other so as to form a loop on the circuit board. Therefore, the application of the light emitting device is more flexible.

In the present embodiment of the invention, as illustrated in FIG. 3C, each of the light emitting packages 210 has a light emitting chip 211, such as a light emitting diode (LED) chip. The circuit board 230 has a long-side direction D1 and a short-side direction D2. The first pads of the first undetermined power input end and the second undetermined power input end of the present embodiment of the invention are arranged along the short-side direction. That is, as illustrated in FIG. 3C, the first pads 231a and 231b of the first undetermined power input end 231 are arranged along the short-side direction D2, and the first pads 232a and 232b of the second undetermined power input end 232 are also arranged along the short-side direction D2.

In addition, in the present embodiment of the invention, the number of the first pads of each of the first undetermined power input end and the second undetermined power input end is twice as the kinds of the light emitting chips 211. As the light emitting packages 210 has one kind of light emitting chip 211 only, the first undetermined power input end 231 has two first pads 231a and 231b. Furthermore, the second undetermined power input end 232 also has two first pads 232a and 232b.

Second Embodiment

Figure 4:
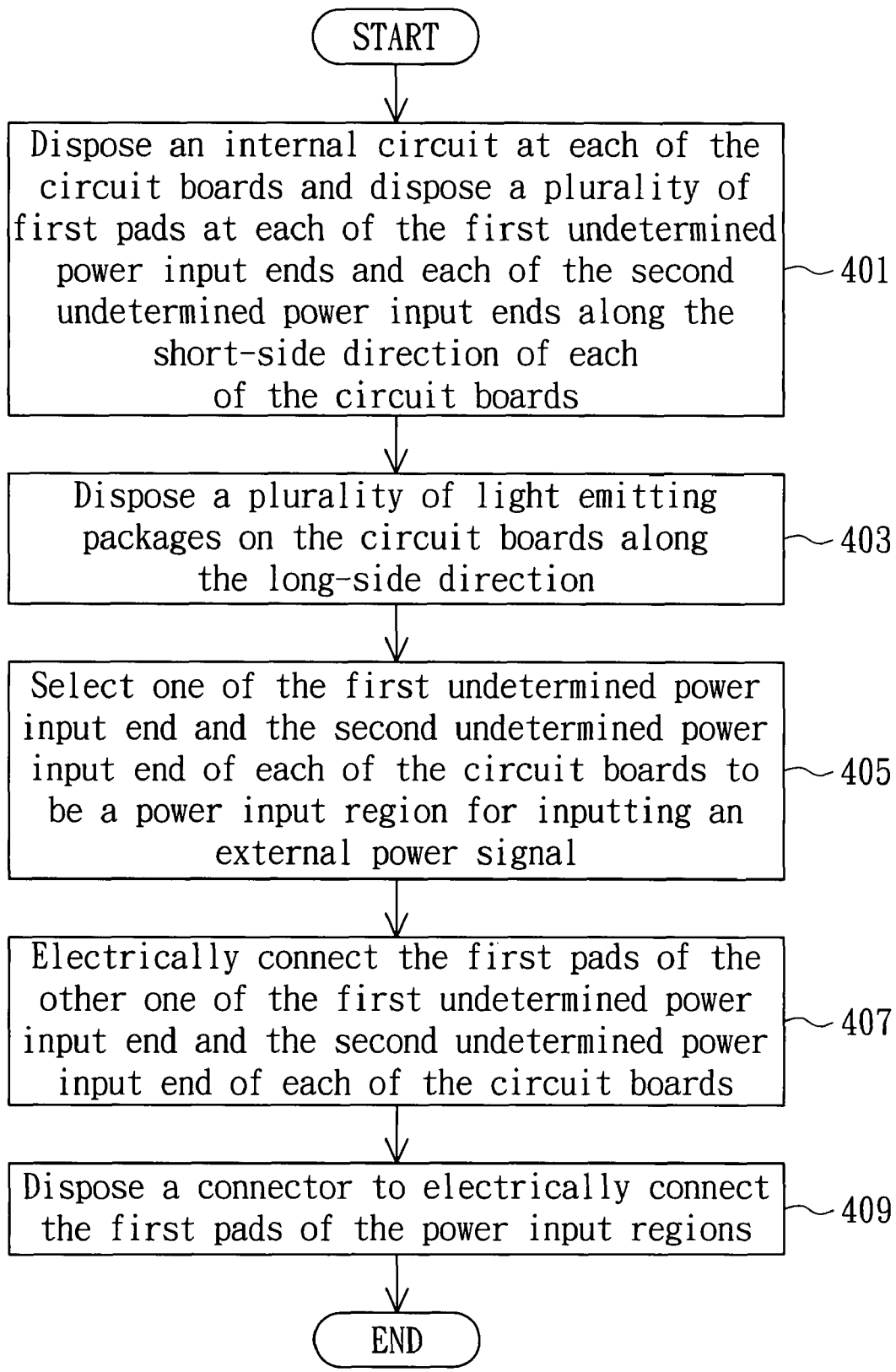
FIG. 4 is a flowchart of a manufacture method of a light emitting device according to a second embodiment of the invention.

Referring to FIG. 4, a flowchart of a manufacture method of a light emitting device according to a second embodiment of the invention is shown. Compared with the flowchart of FIG. 2, the flowchart of FIG. 4 further comprises steps 401, 403 and 409. Steps 405 and 407 of FIG. 4 are the same with step 303 and step 305 of FIG. 2 and it does not say more than what is needed.

Figure 5:
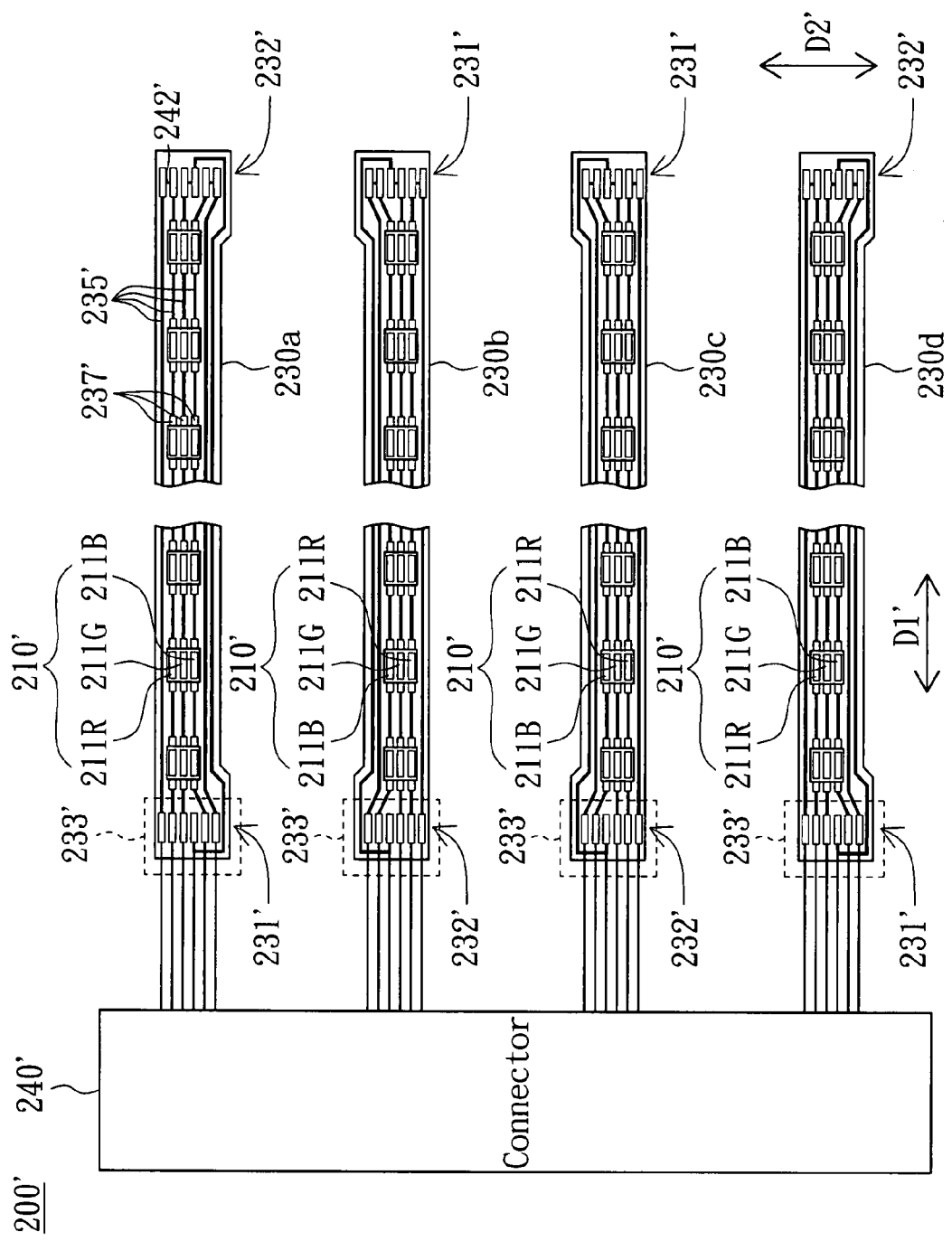
FIG. 5 is a perspective of the light emitting device according to the second embodiment of the invention.

Also referring to FIG. 5, a perspective of the light emitting device according to the second embodiment of the invention is shown. For simplification, the same elements are selectively designated in FIG. 5. The present embodiment of the invention differs from the first embodiment in that the light emitting device 200' has a plurality of circuit boards 230a, 230b, 230c and 230d, and each of the light emitting packages 210 of each of the circuit boards 230a, 230b, 230c and 230d has the light emitting chips of three colors, for example, red light emitting chips 211R, green light emitting chips 211G and blue light emitting chips 211B.

As illustrated in FIG. 4 and FIG. 5, proceeds to step 401, an internal circuit 235' is disposed at each of the circuit boards 230a, 230b, 230c and 230d, and a plurality of first pads is disposed at each of the first undetermined power input ends 231' and each of the second undetermined power input ends 232' along the short-side direction D2' of each of the circuit boards 230a, 230b, 230c and 230d. The internal circuit 235' has a plurality of second pads 237' electrically connected to the light emitting packages 210'. In the present embodiment of the invention, the number of the first pads of each of the first undetermined power input end and the second undetermined power input end is twice as the kinds of the light emitting chips. In the present embodiment of the invention, the light emitting chips have three kinds, so the number of the first pads of each of the first undetermined power input end and the second undetermined power input end is six.

Next, the manufacture method proceeds to step 403, a plurality of light emitting packages 210' is disposed on the circuit boards 230a, 230b, 230c and 230d along the long-side direction D1' of each of the circuit boards 230a, 230b, 230c and 230d, respectively, so that the light emitting chips of three colors (211R, 211G and 211B) disposed in each of the light emitting packages 210' are arranged along the short-side direction D2' according to a predetermined order. The light emitting packages 210' are electrically connected to the second pads 237'. After step 403, step 405 and step 407 are performed sequentially. As disclosed above, step 405 and step 407 of FIG. 4 are the same with step 303 and step 305 of FIG. 2 and it does not say more than what is needed.

In the present embodiment of the invention, in step 405, the first undetermined power input ends 231' of the circuit boards 230a and 230d are selected to be the power input regions 233', and the second undetermined power input ends 232' of the circuit boards 230b and 230c are selected to be the power input regions 233'. Thus, in step 407, the first pads of the second undetermined power input ends 232' of the circuit boards 230a and 230d are electrically connected to each other, and the first pads of the first undetermined power input ends 231' of the circuit boards 230b and 230c are electrically connected to each other. Therefore, through the design of the first undetermined power input end and the second undetermined power input end of each of the circuit boards, the arrangement of the circuit boards is determined according to a user's requirement.

In the present embodiment of the invention, in step 407, the first pads of the second undetermined power input ends 232' of the circuit boards 230a and 230d are electrically connected to each other by at least one solder 242', and so are the first pads of the first undetermined power input ends 231' of the circuit boards 230b and 230c. However, for example, 0 Ohm resistors also can be used to electrically connect the first pads of the first undetermined power input ends 231' or the second undetermined power input ends 232'.

Then, the manufacture method proceeds to step 409, a connector 240' is disposed to electrically connect the first pads of the power input regions 233' for inputting an external power signal. Alternatively, in step 409 of the present embodiment of the invention, at least one solder wire (not illustrated) is disposed to electrically connect the first pads of the power input regions 233' for inputting the external power signal.

Thus, the light emitting device 200' which can be disposed in a display apparatus (not illustrated) is used for providing a direct type backlight light source.

In step 405 of the present embodiment of the invention, the first undetermined power input ends 231' of the circuit boards 230a and 230d are selected to be the power input regions 233' and the second undetermined power input ends 232' of the circuit boards 230b and 230c are selected to be the power input regions 233'. However, the above selection of the power input region is not limited. As a result, the application of the circuit boards is more flexible, and the circuit boards can be arranged alternately in the light emitting device 200' because of the design of the first undetermined power input end and the second undetermined power input end for reducing the over-concentration of a particular color in a certain direction.

According to the light emitting device and the manufacture method thereof disclosed in the above embodiments of the invention, through the design of the first undetermined power input end and the second undetermined power input end of the circuit boards, the application of the light emitting device having such circuit boards is more flexible. In addition, the number of the circuit boards disposed at a linked board is not limited to be even for further saving the manufacture cost of the light emitting device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting device disposed in a display apparatus, comprising:
   a plurality of light emitting packages; and
   at least one circuit board comprising a first undetermined power input end and a second undetermined power input end, wherein the light emitting packages are disposed on the circuit board, the first undetermined power input end and the second undetermined power input end are respectively disposed at two ends of the circuit board, the first undetermined power input end and the second undetermined power input end are electrically connected to the light emitting packages, each of the first undetermined power input end and the second undetermined power input end has at least two first pads, the first undetermined power input end is a power input region, and the first pads of the second undetermined power input end are electrically connected to each other.

2. The light emitting device according to claim 1, wherein the light emitting device further comprises:
   a connector electrically connected to the first pads of the power input region.

3. The light emitting device according to claim 1, wherein the light emitting device further comprises:
   at least one solder wire disposed at the power input region and electrically connected to the first pads of the power input region.

4. The light emitting device according to claim 1, wherein the light emitting device further comprises:
   at least one solder or at least one resistor electrically connected the first pads of the second undetermined power input end, wherein the resistance of the resistor is 0 Ohm.

5. The light emitting device according to claim 1, wherein the circuit board further comprises:
   an internal circuit electrically connected to the first undetermined power input end and the second undetermined power input end; and
   a plurality of second pads disposed in the internal circuit and electrically connected to the light emitting packages.

6. The light emitting device according to claim 1, wherein the light emitting device comprises a plurality of circuit boards, each of which has a long-side direction and a short-side direction, and the circuit boards are arranged along the short-side direction.

7. The light emitting device according to claim 1, wherein the circuit board has a long-side direction and a short-side direction, each of the light emitting packages has at least one light emitting chip, each of the first undetermined power input end and the second undetermined power input end has a plurality of first pads arranged along the short-side direction, and the number of the first pads of each of the first undetermined power input end and the second undetermined power input end of the circuit board is twice as the kinds of the light emitting chips.

8. The light emitting device according to claim 7, wherein the light emitting packages each of which has a plurality of light emitting chips of three colors are arranged along the long-side direction and the light emitting chips of three colors are arranged along the short-side direction according to a predetermined order.

9. The light emitting device according to claim 7, wherein the light emitting chip is a light emitting diode (LED) chip.

* * * * *